US010920808B2

(12) United States Patent
Aoyama

(10) Patent No.: US 10,920,808 B2
(45) Date of Patent: Feb. 16, 2021

(54) NOISE SUPPRESSION MEMBER

(71) Applicant: Kitagawa Industries Co., Ltd., Aichi (JP)

(72) Inventor: Hiroshi Aoyama, Aichi (JP)

(73) Assignee: Kitagawa Industries Co., Ltd., Aichi (JP)

( * ) Notice: Subject to any disclaimer, the term of this patent is extended or adjusted under 35 U.S.C. 154(b) by 660 days.

(21) Appl. No.: 15/565,707

(22) PCT Filed: Nov. 16, 2016

(86) PCT No.: PCT/JP2016/084015
§ 371 (c)(1),
(2) Date: Oct. 11, 2017

(87) PCT Pub. No.: WO2017/094513
PCT Pub. Date: Jun. 8, 2017

(65) Prior Publication Data
US 2018/0073529 A1    Mar. 15, 2018

(30) Foreign Application Priority Data

Nov. 30, 2015  (JP) .............................. JP2015-233994

(51) Int. Cl.
*H01F 27/02* (2006.01)
*F16B 2/10* (2006.01)
(Continued)

(52) U.S. Cl.
CPC ............ *F16B 2/10* (2013.01); *B60R 16/0215* (2013.01); *H01F 17/06* (2013.01); *H02G 3/30* (2013.01);
(Continued)

(58) Field of Classification Search
USPC .................................................. 361/117–119
See application file for complete search history.

(56) References Cited

U.S. PATENT DOCUMENTS 5,003,278 A *  3/1991  May ....................... H01F 17/06
                                                         174/92
5,291,172 A    3/1994  Ito et al.
(Continued)

FOREIGN PATENT DOCUMENTS

DE      4223044 A1    1/1993
DE      19730109      2/1998
(Continued)

OTHER PUBLICATIONS

International Search Report dated Jan. 31, 2017 from International Application No. PCT/JP2016/084015, 4 pages.
(Continued)

*Primary Examiner* — Danny Nguyen
(74) *Attorney, Agent, or Firm* — Meunier Carlin & Curfman LLC

(57) ABSTRACT

A noise suppression member comprises a magnetic core and a case that houses the magnetic core therein. The case comprises a first housing and a second housing that form a housing space to house the magnetic core; a locking mechanism that allows the first housing and the second housing to be fixed to each other through engagement of a claw with a claw receiver; and a support receiver. The claw receiver comprises a movable portion displaceable to a first position and a second position, and the claw is released from the claw receiver when the movable portion is displaced to the second position. The movable portion is nondisplaceable to the second position when the support is inserted into the support receiver.

5 Claims, 11 Drawing Sheets

(51) Int. Cl.
    *H01F 17/06*     (2006.01)
    *B60R 16/02*     (2006.01)
    *H02G 3/30*     (2006.01)
    *H05K 9/00*     (2006.01)
    *H01F 27/26*     (2006.01)

(52) U.S. Cl.
    CPC ............ *H01F 27/02* (2013.01); *H01F 27/263* (2013.01); *H05K 9/0018* (2013.01)

(56) References Cited

U.S. PATENT DOCUMENTS

| | | | |
|---|---|---|---|
| 6,023,023 A | 2/2000 | Takeuchi | |
| 6,072,125 A | 6/2000 | Takeuchi | |
| 6,118,077 A | 9/2000 | Takeuchi | |
| 7,859,378 B2 * | 12/2010 | Merck | G01R 1/22 336/174 |
| 2016/0343496 A1 * | 11/2016 | Mukuno | H01F 27/02 |

FOREIGN PATENT DOCUMENTS

| | | |
|---|---|---|
| GB | 2258089 A | 1/1993 |
| JP | 2015-015828 A | 1/2015 |

OTHER PUBLICATIONS

Communication in Cases for Which No Other Form is Applicable dated Jun. 29, 2018, and English Translation of Written Opinion from International Application No. PCT/JP2016/084015, 5 pages.
Communication in Cases for Which No Other Form is Applicable and English Translation of Written Opinion dated Jan. 31, 2017, from International Application No. PCT/JP2016/084015, 9 pages.

* cited by examiner

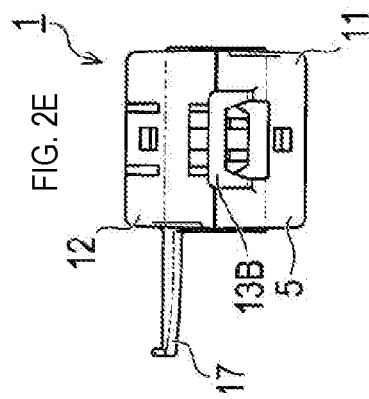
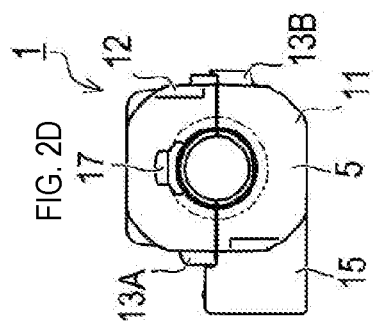
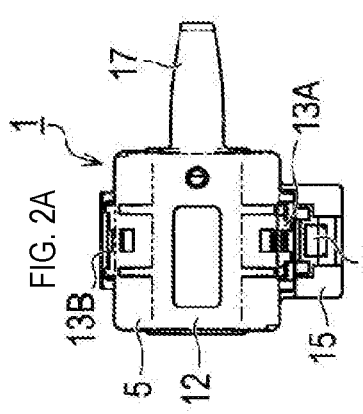
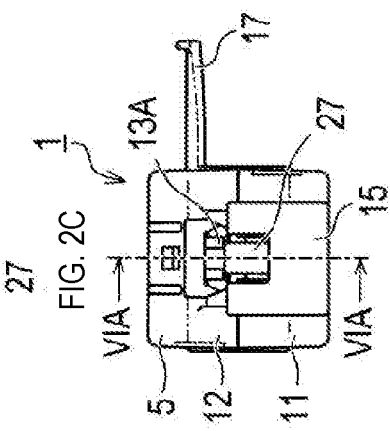
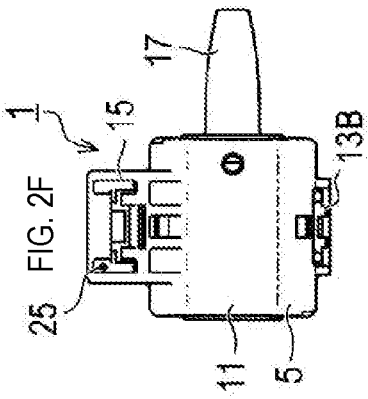
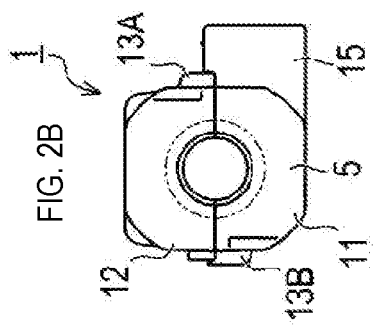

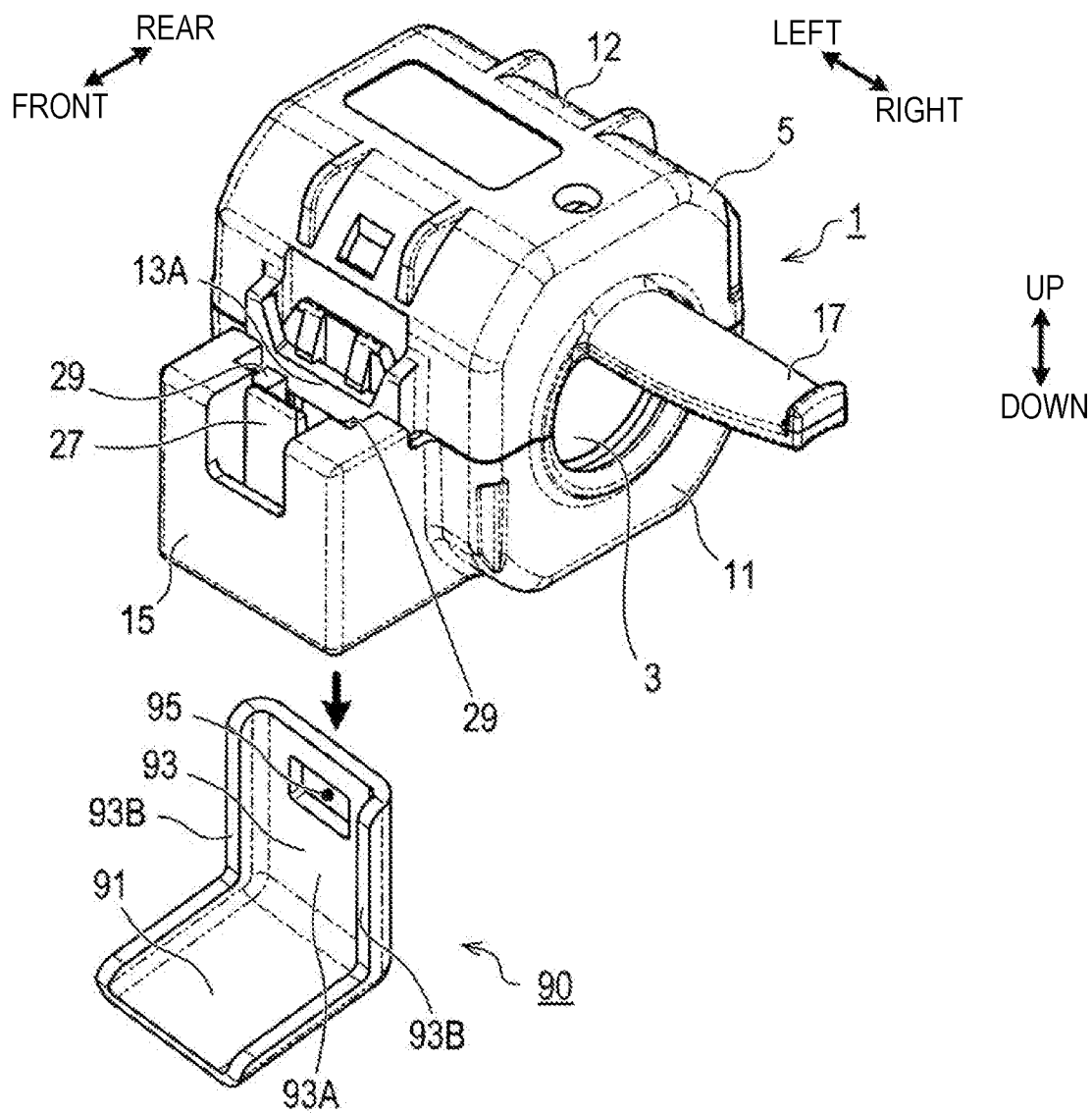

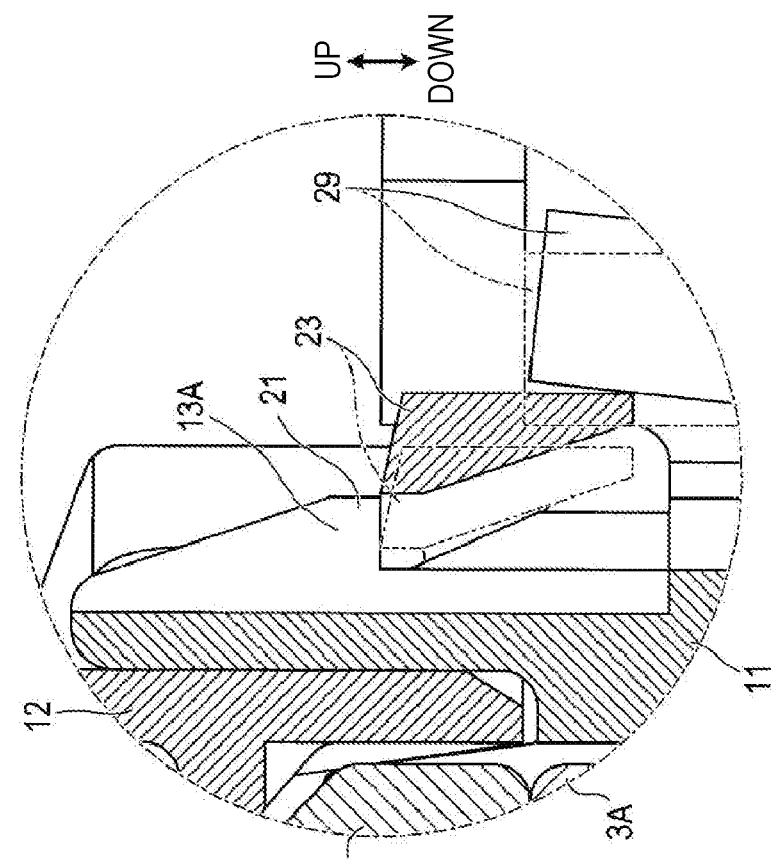
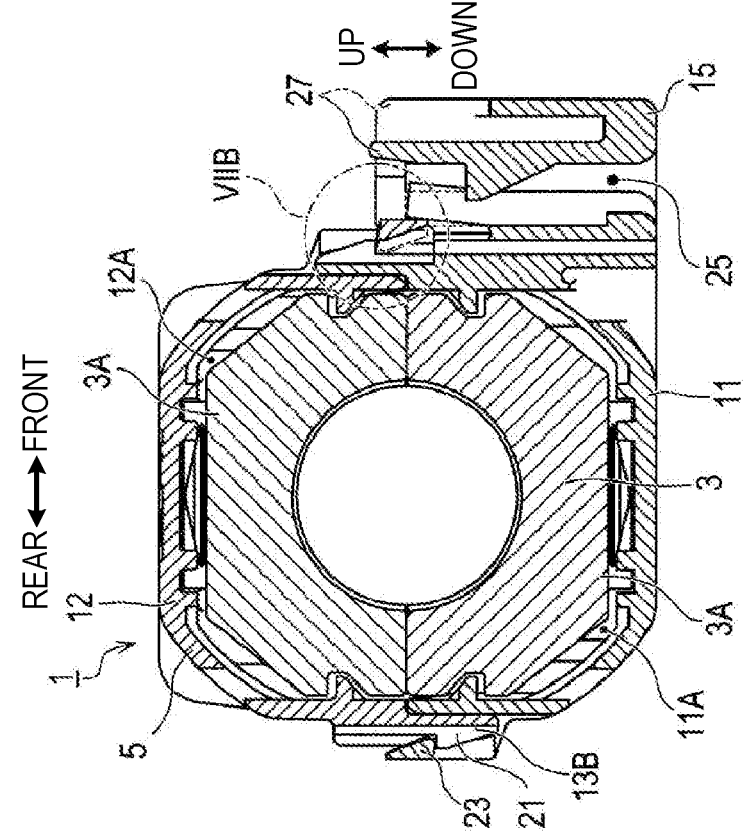

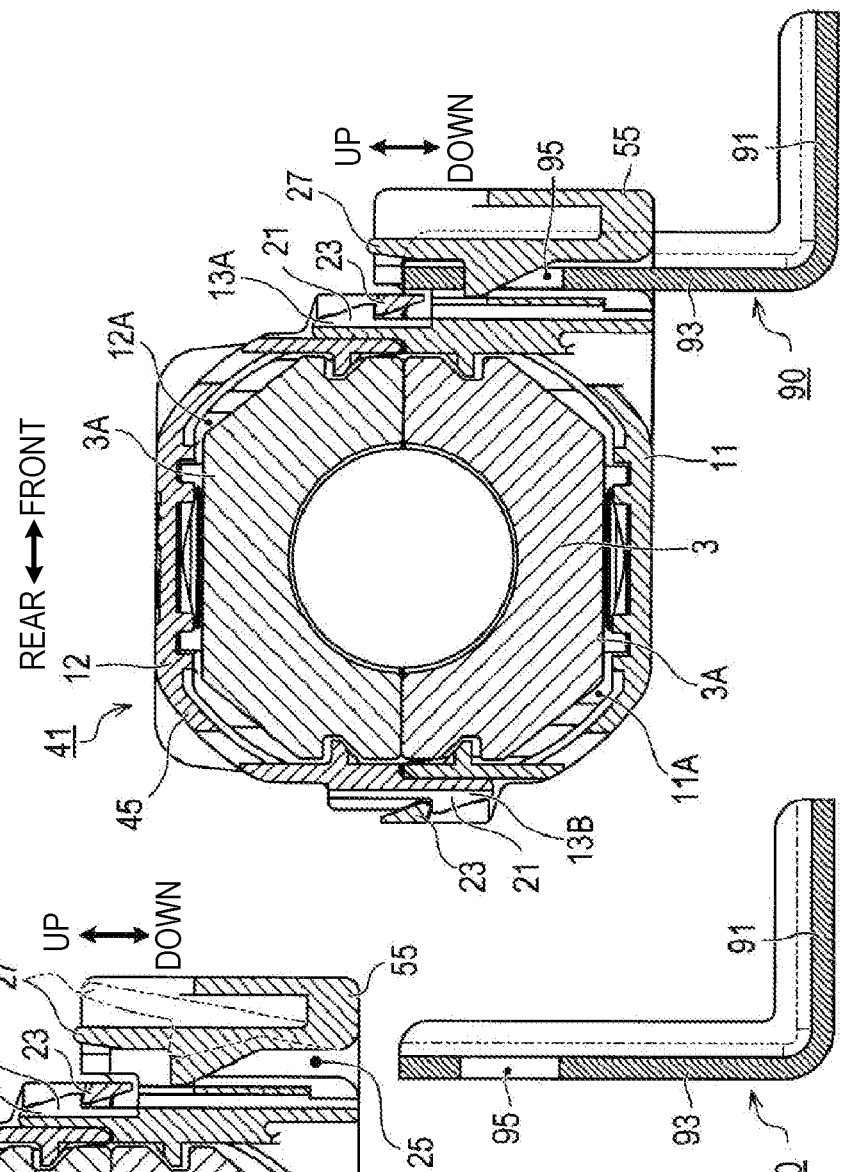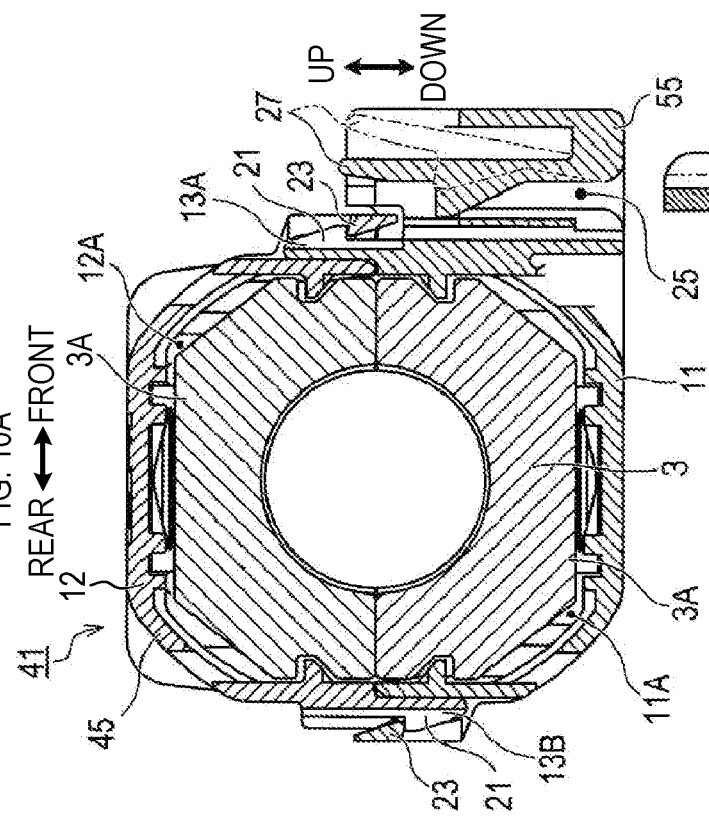

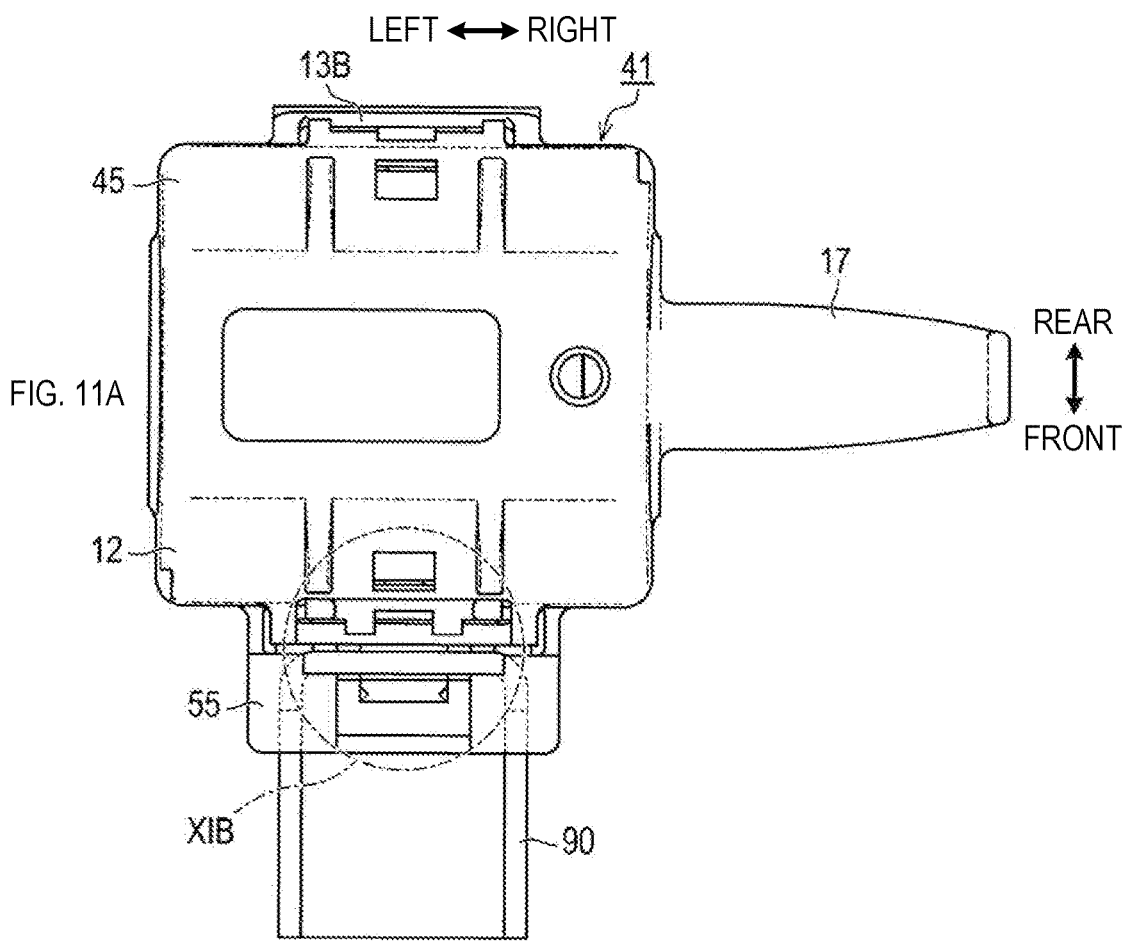
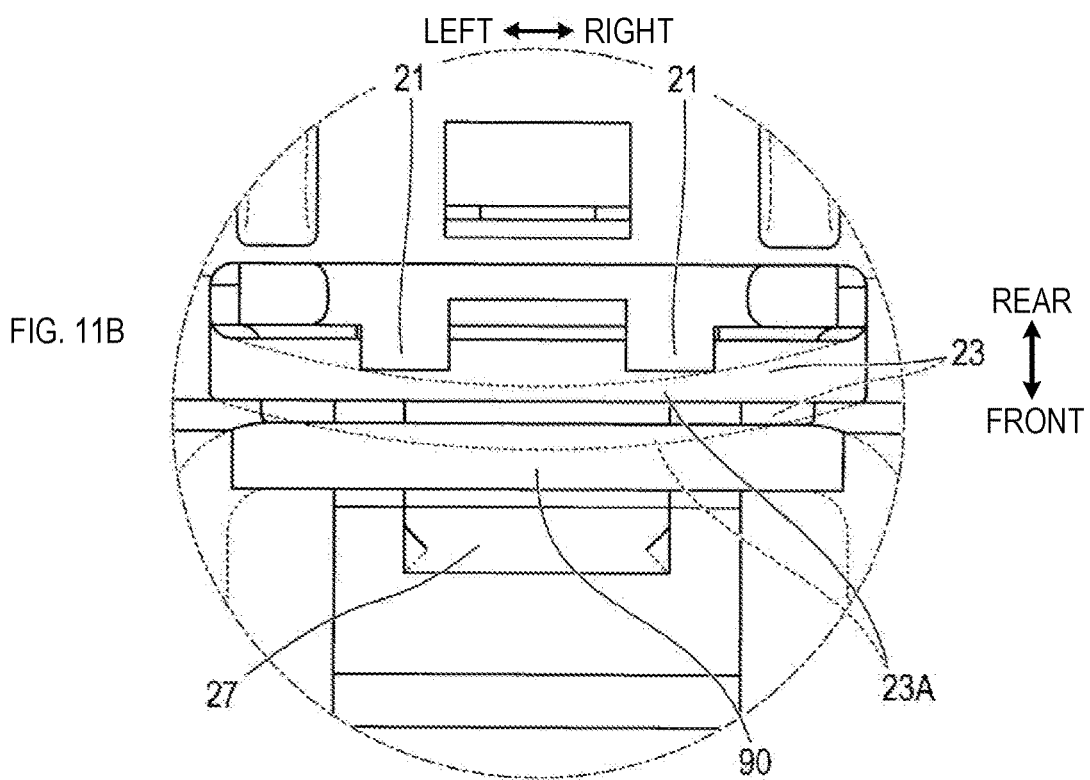

NOISE SUPPRESSION MEMBER

TECHNICAL FIELD

The present disclosure relates to a noise suppression member.

BACKGROUND ART

There has been proposed a noise suppression member configured to include a magnetic core housed in a case and having a fixing portion to be fixed to a fixation target is proposed (see, for example, Patent Document 1). Patent Document 1 below includes a description that the aforementioned noise suppression member provides an effect that a weight of the magnetic core is not applied to a corrugated tube or various cables housed therein. Further, there is also a description that the same effect can be obtained if the noise suppression member is directly attached to a cable or a bundle of cables without using the corrugated tube.

PRIOR ART DOCUMENTS

Patent Documents

Patent Document 1: Japanese Unexamined Patent Application Publication No. 2015-15828

SUMMARY OF THE INVENTION

Problems to be Solved by the Invention

However, in the technology disclosed in Patent Document 1, when the noise suppression member is used in an environment, such as in vehicles, where great vibrations may act thereon, there is a possibility that such vibrations may cause opening of the case. When such event occurs, the magnetic core may, for example, fall off the case, and the effect of the noise suppression member may not be exhibited properly.

In view of the above, it is desirable to provide a noise suppression member having a case unlikely to open during use of the noise suppression member.

Means for Solving the Problems

A noise suppression member described below comprises a magnetic core comprising core parts, each core part including a magnetic material, and formed in an annular shape by combining the core parts; and a case configured to house the magnetic core therein. The case comprises a first housing and a second housing that comprise respective recesses and form a housing space to house therein the magnetic core when the recesses are arranged opposite to each other; a locking mechanism that comprises a claw provided to at least one of the first housing or the second housing and a claw receiver provided to at least the other of the first housing or the second housing, and allows the first housing and the second housing to be fixed to each other through engagement of the claw with the claw receiver when the first housing and the second housing are arranged at a position where the housing space is formed; and a support receiver into which a support capable of supporting the case is inserted when the case is attached to the support. At least one of the claw or the claw receiver comprises a movable portion displaceable to a first position and a second position, and being configured such that the claw is engaged with the claw receiver when the movable portion is displaced to the first position, whereas the claw is released from the claw receiver when the movable portion is displaced to the second position, and such that the movable portion is nondisplaceable to the second position when the support is inserted into the support receiver.

The noise suppression member of the present disclosure is a member that is attached to an outer periphery of an electric cable, a tube, or the like through which an electric wire passes and attenuates a noise current flowing through the electric wire. The magnetic core comprises an annular body that includes the magnetic material. The core parts are parts made of the magnetic material that configure the magnetic core. Each of the core parts is configured to form the annular body when combined together. Although the case may include any material that allows configuration of each part included in the case, the case includes a resin material in a typical example.

According to the noise suppression member configured as above, the case can be attached to the support by inserting the support into the support receiver. Moreover, the movable portion cannot be displaced to the second position in the locking mechanism when the support is inserted into the support receiver. As a result, the movable portion cannot be displaced from the first position to the second position, and thereby the engaged state of the claw with the claw receiver can be maintained. Accordingly, the first housing and the second housing are maintained to be fixed to each other, and thereby the core parts housed therein remain to configure the magnetic core in the annular shape. As a result, even in a case where the noise suppression member is used, for example, in an environment where great vibrations may act thereon, a possibility can be reduced that locking provided by the locking mechanism is released due to such vibrations, and thereby the effect of the noise suppression member can be properly exhibited.

BRIEF DESCRIPTION OF THE DRAWINGS

FIG. 2A is a plan view of the noise suppression member of the first embodiment. FIG. 2B is a left-side view of the noise suppression member of the first embodiment. FIG. 2C is a front view of the noise suppression member of the first embodiment. FIG. 2D is a right-side view of the noise suppression member of the first embodiment. FIG. 2E is a rear view of the noise suppression member of the first embodiment. FIG. 2F is a bottom view of the noise suppression member of the first embodiment.

FIG. 4 is a perspective view showing that the noise suppression member of the first embodiment can be attached to the support even when a direction of the support is reversed by 180 degrees with respect to a direction shown in FIG. 3A.

FIG. 7A is a sectional view showing a movement of a movable portion in a locking mechanism. FIG. 7B is an enlarged view of an area VIIB shown in FIG. 7A.

FIG. 10A is a sectional view showing the noise suppression member of the second embodiment in a detached state from the support. FIG. 10B is a sectional view showing the noise suppression member of the second embodiment in an attached state to the support.

FIG. 11A is a plan view showing a positional relationship between the support and a claw receiver. FIG. 11B is an enlarged view of an area XIB shown in FIG. 11A.

MODE FOR CARRYING OUT THE INVENTION

Figure 1A:
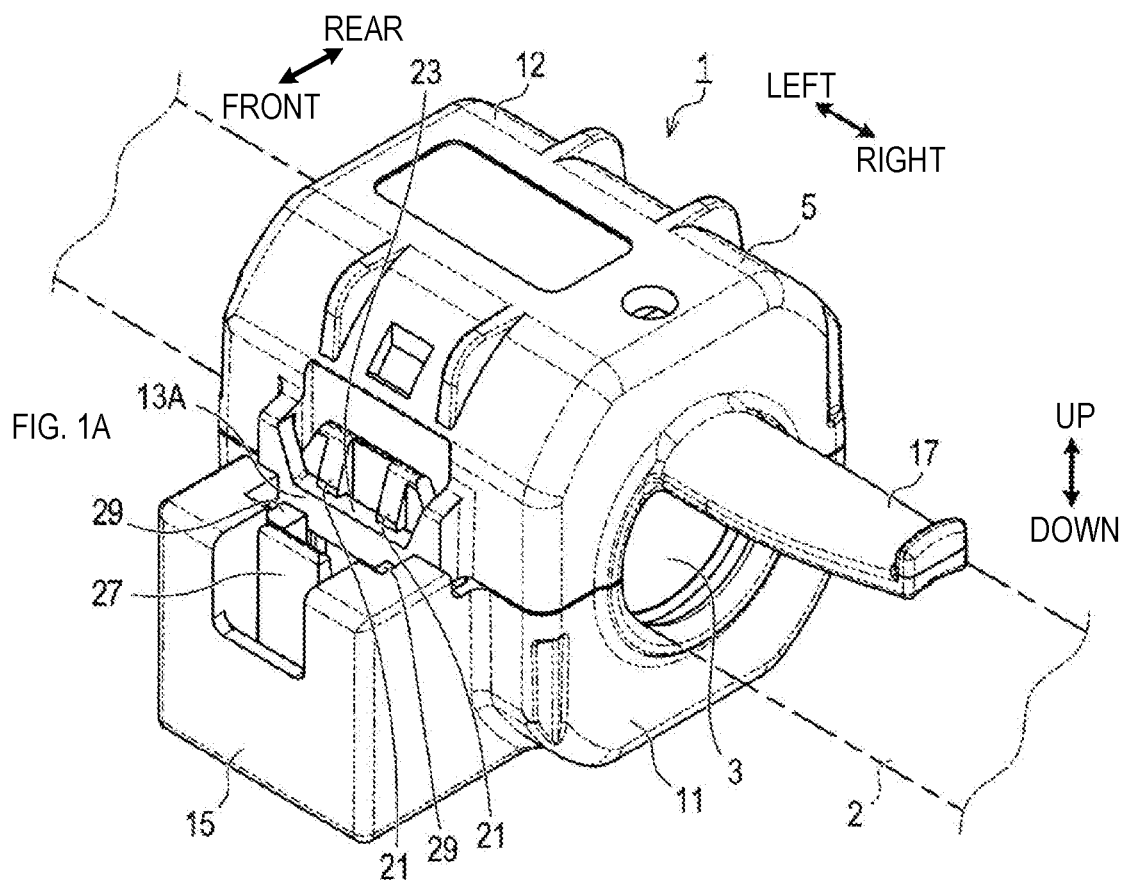
FIG. 1A is a perspective view of a noise suppression member of a first embodiment as viewed from the upper right front.
Figure 1B:
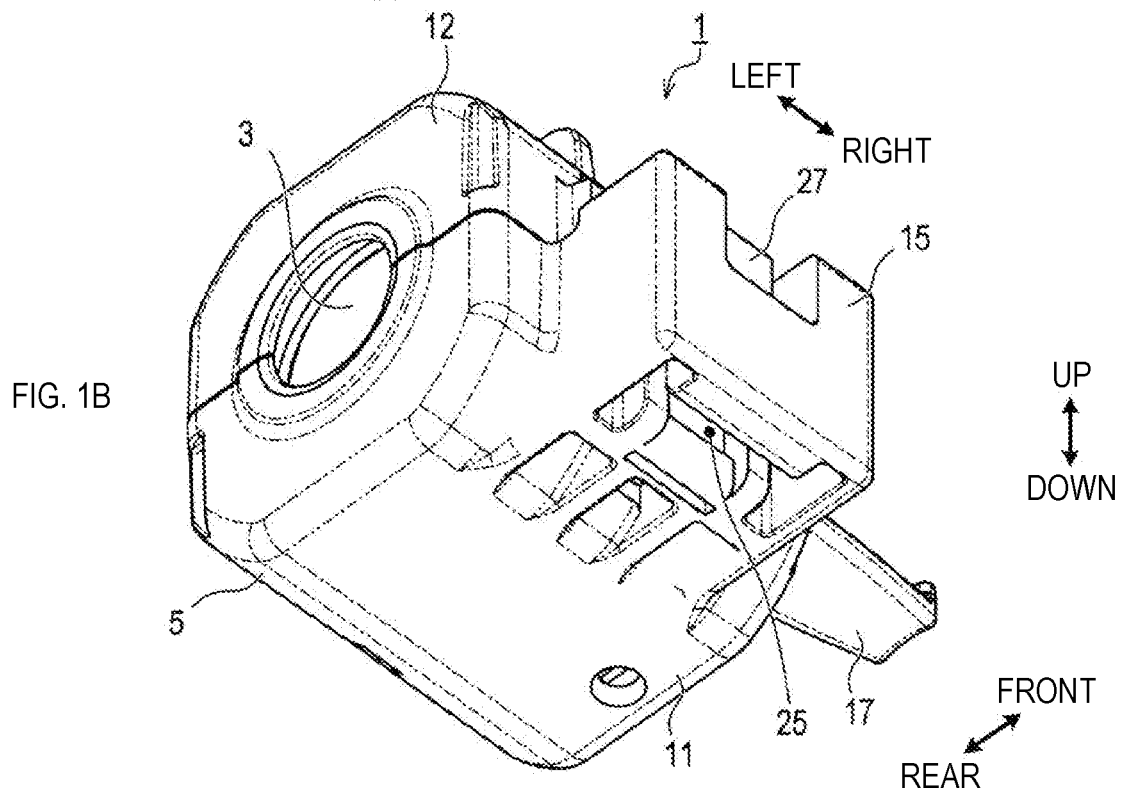
FIG. 1B is a perspective view of the noise suppression member of the first embodiment as viewed from the lower left front.

Now, the aforementioned noise suppression member will be described by using example embodiments. The following description will be provided using front, rear, left, right, up, and down directions indicated in the drawings. These directions are relative directions defined as follows: in six-side views (see FIG. 2A to FIG. 2F) of the noise suppression member, a portion seen in the front view faces a front direction, a portion seen in the rear view faces a rear direction, a portion seen in the left-side view faces a left direction, a portion seen in the right-side view faces a right direction, a portion seen in the plan view faces an up direction, and a portion seen in the bottom view faces a down direction. However, each of the directions is merely defined to simply describe relative positional relationships among components that configure the noise suppression member. Thus, it is not specified in which direction the noise suppression member is oriented, for example, when being used.

(1) First Embodiment

[Configuration of Noise Suppression Member]

As shown in FIG. 1A, a noise suppression member 1 is a member that is attached to an outer periphery of a corrugated tube 2 and attenuates a noise current flowing through an electric cable (not shown) disposed at an inner side of the corrugated tube 2. The noise suppression member 1 may also be attached directly to an outer periphery of the electric cable without using the corrugated tube 2.

Figure 6A:
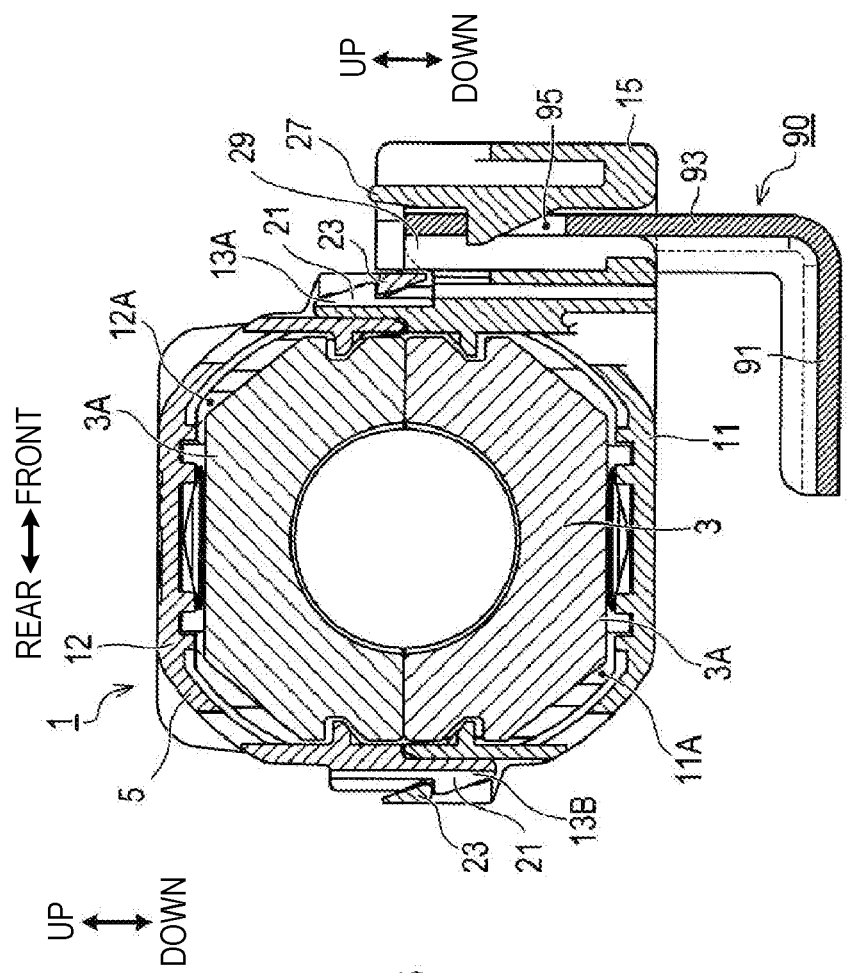
FIG. 6A is a sectional view showing the noise suppression member of the first embodiment in the detached state from the support.

As shown in each of FIG. 1A, FIG. 1B, and FIG. 2A to FIG. 2F, the noise suppression member 1 comprises a magnetic core 3 and a case 5. As shown in FIG. 6A, the magnetic core 3 comprises two core parts 3A each including a magnetic material and is formed in an annular shape by combining the two core parts 3A. FIG. 6A is a sectional view taken along a section indicated by a line VIA-VIA in FIG. 2C.

The case 5 is a resin-made container for housing the magnetic core 3. The case 5 comprises a first housing 11, a second housing 12, locking mechanisms 13A and 13B, a support receiver 15, and an extending piece 17. The first housing 11 and the second housing 12 respectively include recesses 11A and 12A (see FIG. 6A) and form a housing space that houses the magnetic core 3 therein when the recesses 11A and 12A are arranged at positions so as to face each other.

The extending piece 17 extends from the second housing 12 in the right direction specified in the figures. When the noise suppression member 1 is attached to the outer periphery of the corrugated tube 2, the extending piece 17 is located along the outer periphery of the corrugated tube 2. When the extending piece 17 is employed, the noise suppression member 1 can be firmly fixed to the corrugated tube 2 by tightening the extending piece 17 and the corrugated tube 2 using a binding band (not shown) and the like, which is wound around the extending piece 17 and the outer periphery of the corrugated tube 2.

As shown in FIG. 6A, one of the locking mechanism 13A comprises a claw 21 provided to the first housing 11 and a claw receiver 23 provided to the second housing 12. The other locking mechanism 13B comprises the claw 21 that is provided to the second housing 12 and the claw receiver 23 provided to the first housing 11. These claws 21 and the claw receivers 23 are configured such that the claw 21 is engaged with the claw receiver 23 when the first housing 11 and the second housing 12 are positioned so as to form the housing space. This enables fixation of the first housing 11 and the second housing 12 to each other.

Figure 3A:
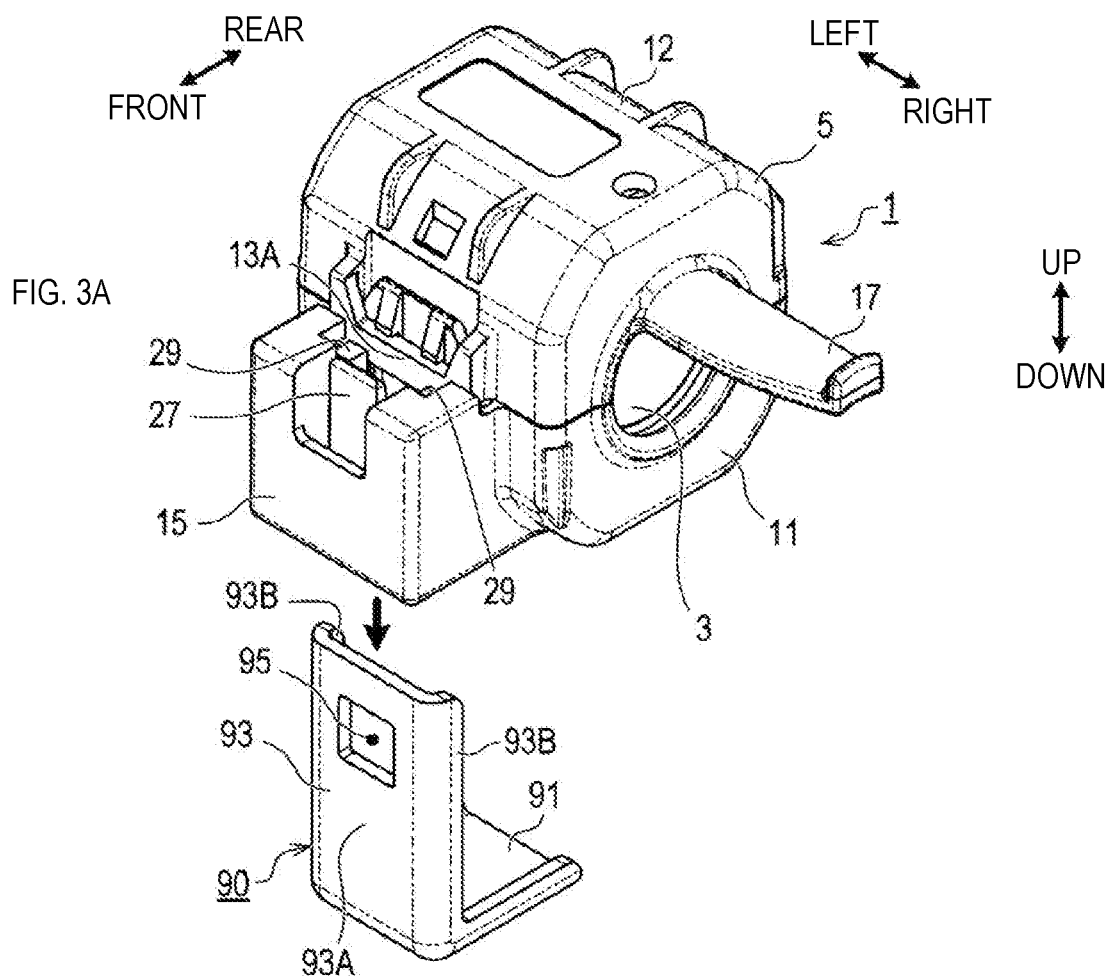
FIG. 3A is a perspective view showing the noise suppression member of the first embodiment in a detached state from a support.
Figure 3B:
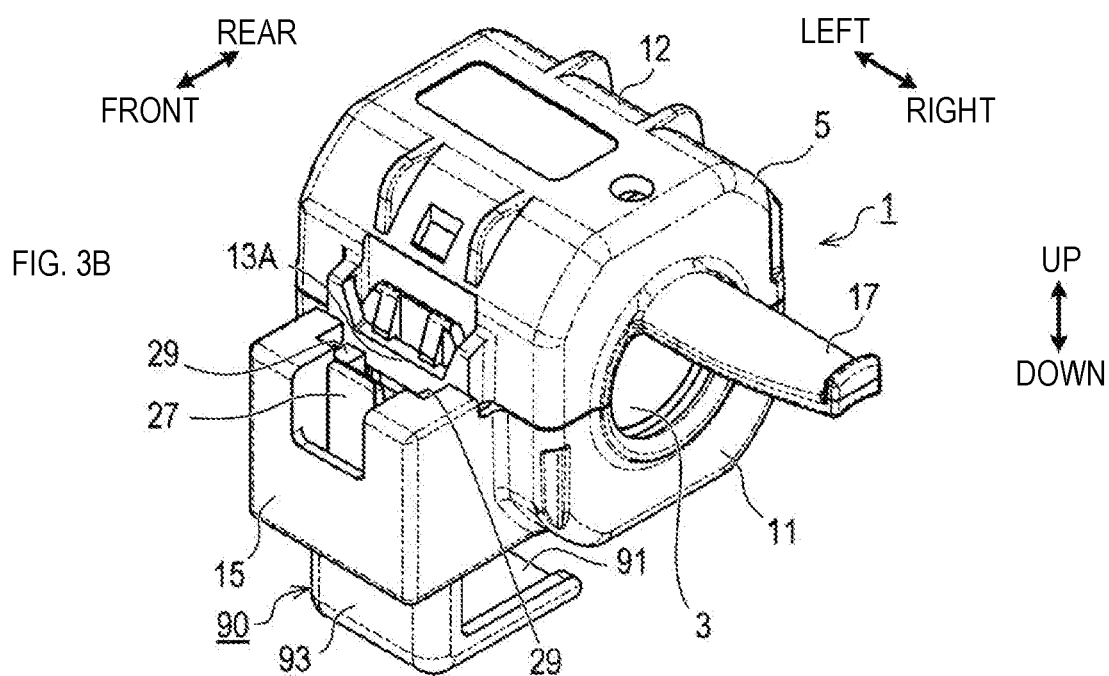
FIG. 3B is a perspective view showing the noise suppression member of the first embodiment in an attached state to the support.

As shown in FIG. 3A and FIG. 3B, the support receiver 15 is a portion into which a support 90 is inserted when the case 5 is attached to the support 90. The support 90 shown exemplarily in FIG. 3A and FIG. 3B is a sheet metal member and comprises a joint part 91, which is a bottom surface seen in the figures, as a joint surface to be joined to a not-shown joining target portion; and an attachment part 93 that extends upwardly from an end of the joint part 91. The attachment part 93 is a part to be inserted into the support receiver 15, and comprises a base part 93A formed in a plate-shape and bent parts 93B that are bent at both ends of the base part 93A and extend in a thickness direction of the base part 93A (the rear direction in the figures).

The attachment part 93 has, as an insertion direction into the support receiver 15, a direction (the up-down direction in the figures) perpendicular to both the thickness direction of the base part 93A (the front-rear direction in the figures) and a thickness direction of the bent part 93B (the left-right direction in the drawings). The base part 93A comprises a through hole 95 that penetrates the base part 93A in its thickness direction. Since the support 90 can be inserted into the support receiver 15 as long as the attachment part 93 is configured according to the aforementioned configuration, the joint part 91 may differ in shape or size from that illustrated in the figures. Further, joining of the joint part 91 to the joining target portion can be performed by optional methods, such as welding, screwing, and adhesion.

Figure 5A:
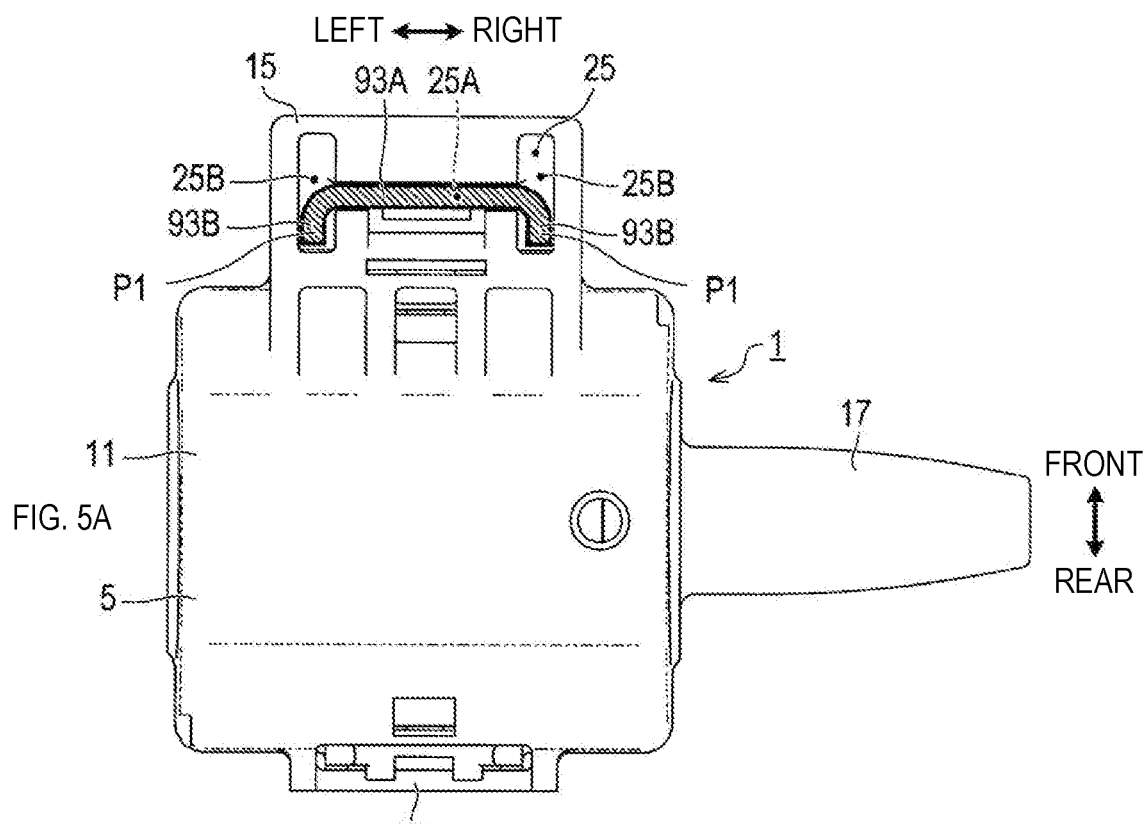
FIG. 5A is a bottom view showing a positional relationship between the support and the noise suppression member in a case where the support is oriented in the directions shown in FIG. 3A and FIG. 3B.
Figure 5B:
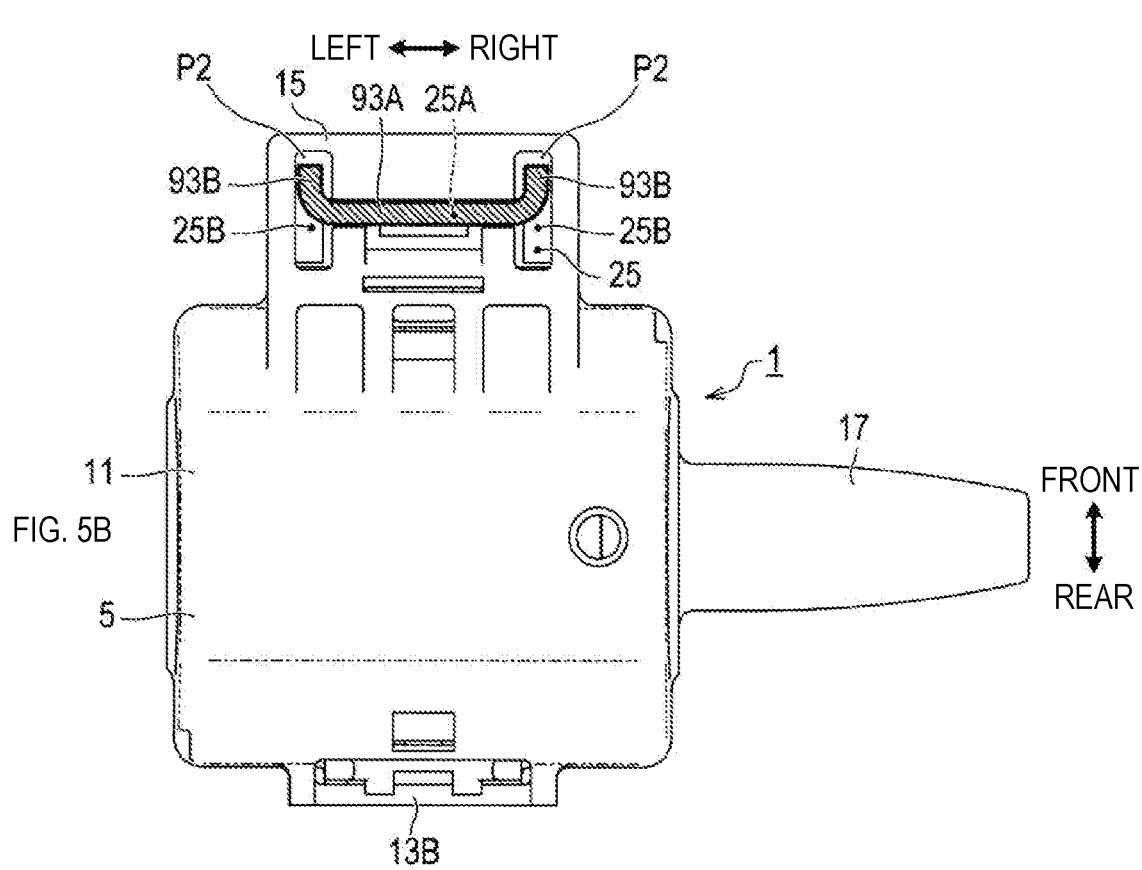
FIG. 5B is a bottom view showing a positional relationship between the support and the noise suppression member in a case where the support is oriented in the direction shown in FIG. 4.

As shown in FIG. 4, the above-described support 90 can be inserted into the support receiver 15 even when the front-back direction of the support is reversed by 180 degrees relative to the direction shown in FIG. 3A and FIG. 3B. More specifically, as shown in FIG. 5A and FIG. 5B, the support receiver 15 comprises an opening 25 where the support 90 is inserted. The opening 25 comprises a base part opening 25A to allow insertion of the base part 93A therein and a bent part opening 25B to allow insertion of the bent part 93B therein. Among the openings, the base part opening 25A is configured so as to allow introduction of the base part 93A therein when the support 90 is in any one of a first orientation (see FIG. 5A) and a second orientation (see FIG. 5B) that have a positional relationship where the thickness direction of the base part 93A is reversed by 180 degrees.

The bent part opening 25B is arranged both in a portion P1 to introduce the bent part 93B when the support 90 is in the first orientation and in a portion P2 to introduce the bent part 93 when the support 90 is in the second orientation. Thus, even though the attachment part 93 is formed having the aforementioned base part 93A and the bent parts 93B, the noise suppression member 1 can be attached to the support 90 in two orientations by reversing the orientation of the noise suppression member by 180 degrees.

Figure 6B:
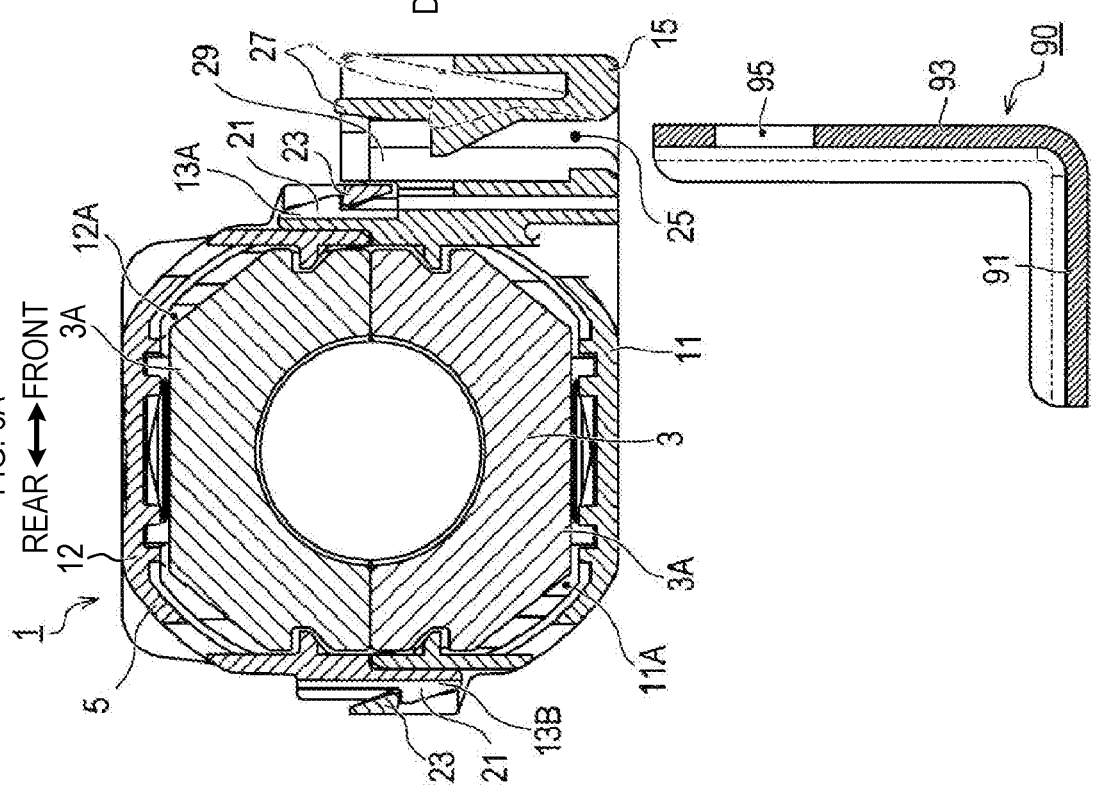
FIG. 6B is a sectional view showing the noise suppression member of the first embodiment in the attached state to the support.

As shown in FIG. 6A and FIG. 6B, the support receiver 15 is provided with a locking part 27. The locking part 27 is configured to be elastically deformable and comprises, as shown in FIG. 6A, a bottom end as a fixed end that is coupled to the support receiver 15 and a top end as a free end that can be displaced in the front-back direction in accordance with elastic deformation. As shown in FIG. 6B, the locking part 27 is engaged with a through hole 95 provided in the support 90 when the support 90 is inserted into the support receiver 15. This enables reduction in relative displacement between the support 90 and the support receiver 15 along a direction in which the support 90 is pulled out from the support receiver 15.

In the present embodiment, the claw receiver 23, of the claw 21 and the claw receiver 23 that configure each of the locking mechanisms 13A and 13B, comprises, as shown in FIG. 7A and FIG. 7B, a movable portion 23A that can be displaced between a first position (a position indicated by double-dot chain lines in FIG. 7B) and a second position (a position indicated by solid lines in FIG. 7B). When the movable portion 23A is displaced to the first position, the claw 21 is engaged with the claw receiver 23, and thereby the claw 21 and the claw receiver 23 cannot be displaced relatively in the up-down direction. Further, when the movable portion 23A is displaced to the second position, the claw 21 is released from the claw receiver 23, and the claw 21 and the claw receiver 23 can be relatively displaced in the up-down direction.

Figure 8A:
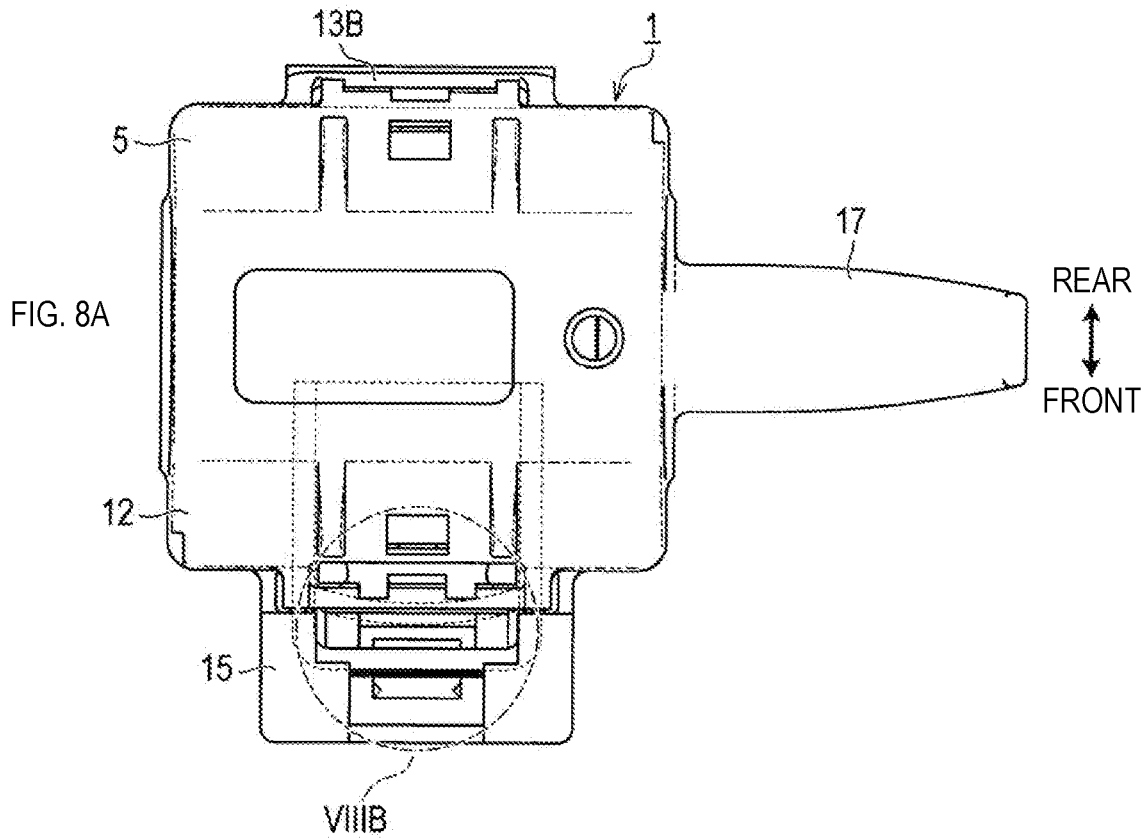
FIG. 8A is a plan view showing a positional relationship among the support, a claw receiver, and a stopper.
Figure 8B:
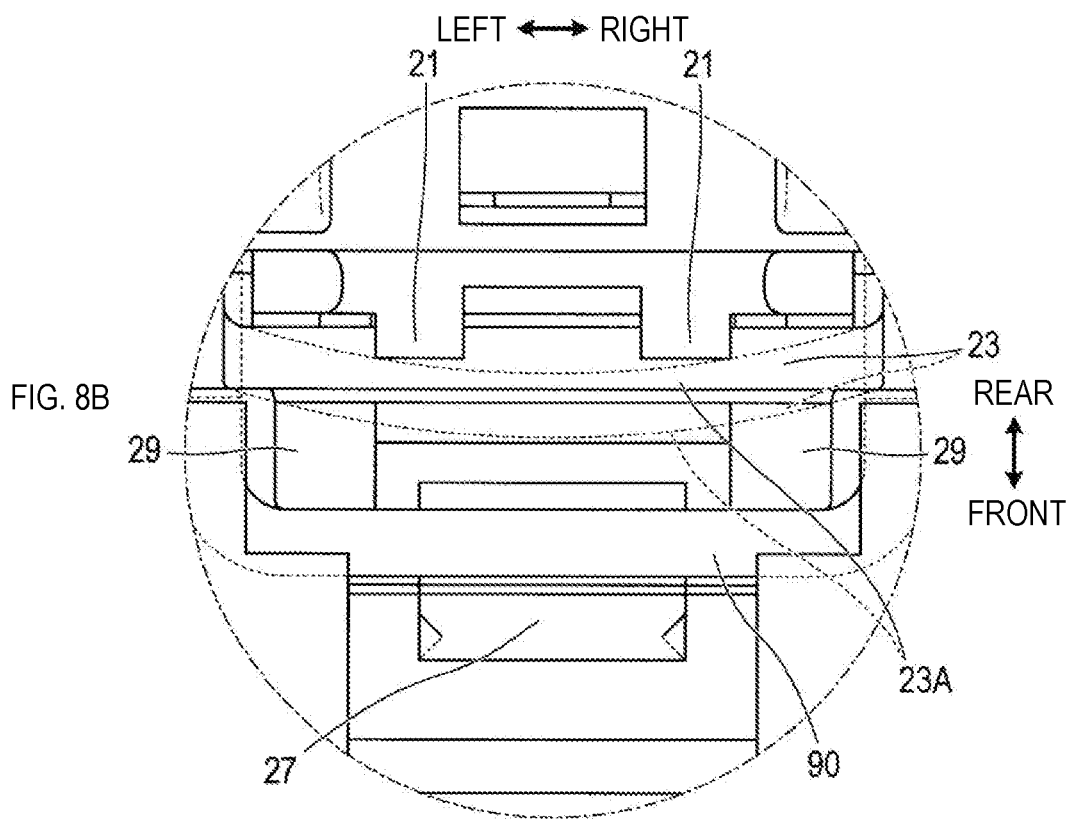
FIG. 8B is an enlarged view of an area VIIIB shown in FIG. 8A.

In a vicinity (the front in the figures) of the claw receiver 23, a stopper 29 is provided. The stopper 29 is in a position between the movable portion 23A and the support 90 in a state where the support 90 is inserted in the support receiver 15. In a state where the support 90 is not inserted in the support receiver 15, the stopper 29 is displaced along with the movable portion 23A when the movable portion 23A is displaced toward the second position. On the other hand, in the state where the support 90 is inserted in the support receiver 15, the support 90 is in a position adjacent to the stopper 29 as shown in FIG. 8A and FIG. 8B, and thus the stopper 29 cannot be displaced to the position of the support 90. As a result, the stopper 29 is held between the movable portion 23A and the support 90 even if an attempt is made to displace the movable portion 23A of the claw receiver 23 toward the second position. Accordingly, the stopper 29 inhibits the displacement of the movable portion 23A to the second position (the position indicated by broken lines in FIG. 8B), and thereby the movable portion 23A cannot be displaced to the second position.

Effect

According to the noise suppression member 1 configured as described above, the case 5 can be attached to the support 90 by inserting the support 90 into the support receiver 15. In addition, when the support 90 is inserted into the support receiver 15, the movable portion 23A cannot be displaced to the second position in the locking mechanisms 13A and 13B. As a result, the movable portion 23A cannot be displaced from the first position to the second position, and thereby a state can be maintained where the claw 21 is engaged with the claw receiver 23. Accordingly, a state of mutual fixation of the first housing 11 and the second housing 12 is maintained, and thereby the core parts 3A housed therein are maintained to form the magnetic core in the annular shape. Thus, for example, even in a case where the noise suppression member is used in an environment where great vibrations may act thereon, a possibility can be reduced that locking provided by the locking mechanisms 13A and 13B is released due to such vibrations, and thereby an effect provided by the noise suppression member 1 can be exhibited properly.

Also, in the noise suppression member 1 of the first embodiment, the displacement of the movable portion 23A to the second position is inhibited by the stopper 29 being held between the movable portion 23A and the support 90. Accordingly, even when the support 90 is arranged outside of a moving range of the movable portion 23A, the claw 21 can be maintained to be engaged with the claw receiver 23 by actions of both the support 90 and the stopper 29.

Further, in the noise suppression member 1, the locking part 27 is engaged with a hole that is arranged in the support 90. Accordingly, the noise suppression member 1 can be firmly attached to the support 90 in comparison with a case where the same locking part 27 is not provided.

In addition, the noise suppression member 1 can be attached to the support 90 in two orientations by reversing the orientation of the noise suppression member 1 by 180 degrees, in spite of the attachment part 93 of the support 90 being configured to have the base part 93A and the bent part 93B. Thus, a highly rigid configuration having the base part 93A and the bent part 93B can be adopted for the support 90, while enabling an enhanced degree of freedom in orientation in arranging the noise suppression member 1 or the support 90.

(2) Second Embodiment

Now, the second embodiment will be described. The second embodiment is an embodiment in which configurations exemplified in the first embodiment are partially modified. Thus, in the second embodiment, detailed descriptions will be provided mainly of differences from the first embodiment, and overlapping descriptions with the first embodiment will be omitted. The same reference numerals as in the first embodiment will be given in the figures to components identical to the components of the first embodiment.

[Configuration of Noise Suppression Member]

Figure 9A:
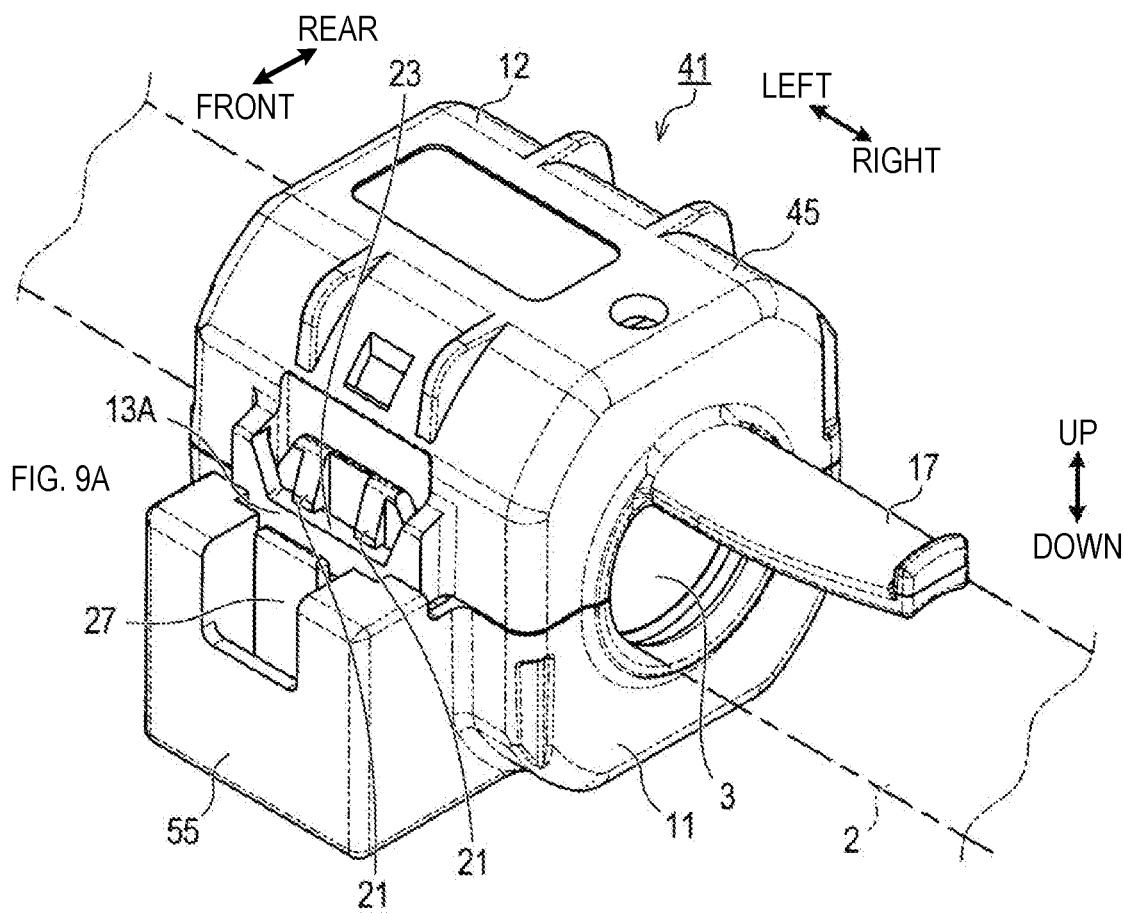
FIG. 9A is a perspective view of a noise suppression member of the second embodiment as viewed from the upper right front.
Figure 9B:
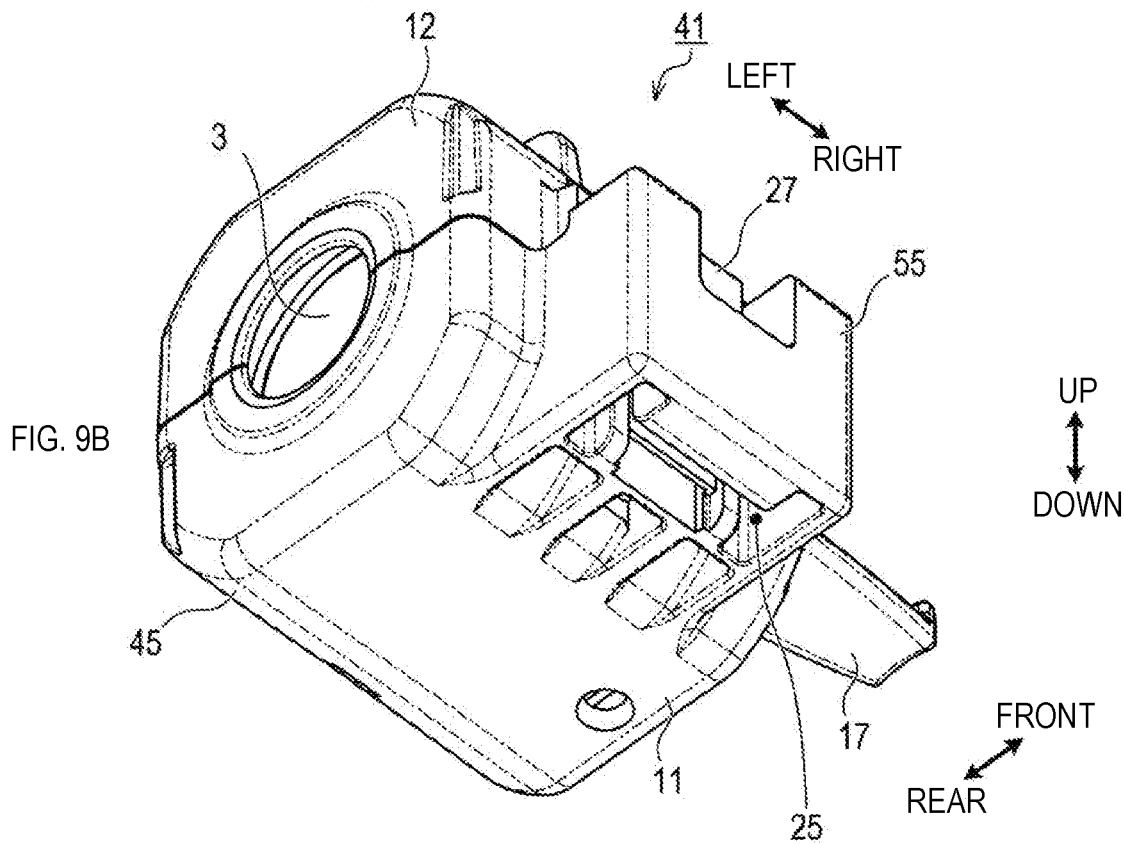
FIG. 9B is a perspective view of the noise suppression member of the second embodiment as viewed from the lower left front.

As shown in FIG. 9A and FIG. 9B, a noise suppression member 41 of the second embodiment comprises the magnetic core 3 and a case 45. The magnetic core 3 is the same as the magnetic core of the first embodiment. However, the case 45 is different in detailed shape from the case 5 of the first embodiment. More specifically, as shown in FIG. 9A and FIG. 9B, a part corresponding to the stopper 29, which is provided in the case 5 of the first embodiment, is not provided to the case 45 of the second embodiment.

Instead, in the case 45 of the second embodiment, when the attachment part 93 of the support 90 is inserted into the support receiver 55, the attachment part 93 is located adjacent to the claw receiver 23 as shown in FIG. 10A and FIG.

10B. As a result, in a state where the support 90 is inserted into the support receiver 55, the claw receiver 23 cannot be displaced to a position of the support 90 as shown in FIG. 11A and FIG. 11B. Accordingly, the support 90 inhibits displacement of the movable portion 23A to the second position (a position indicated by broken lines in FIG. 11B), and thereby the movable portion 23 cannot be displaced to the second position.

Effects

The noise suppression member 41 configured as described above can also achieve the same function and effect as the noise suppression member 1 of the first embodiment, enabling reduction in the possibility that, even in a case where the noise suppression member 41 is used in an environment where great vibrations may act thereon, the locking provided by the locking mechanisms 13A and 13B are released due to such vibrations, and achieving the effect of the noise suppression member 1 properly.

Further, in the case of the second embodiment, when the movable portion 23A is displaced toward the second position with the support 90 being inserted in the support receiver 55, the support 90 contacts the movable portion 23A and inhibits the displacement of the movable portion 23A to the second position. Accordingly, in a case where the support 90 is arranged within the moving range of the movable portion 23A, the claw 21 can be maintained to be engaged with the claw receiver 23 by the function of the support 90 alone without providing a configuration corresponding to the stopper 29.

(3) Other Embodiments

While the noise suppression member has been described using example embodiments, it should be understood that the aforementioned embodiments are merely provided as examples of the present disclosure. That is, the present disclosure is not limited to the above-described example embodiments, but may be practiced in various manners within the scope not departing from the technical idea of the present disclosure.

For example, while the aforementioned embodiments describe an example in which the magnetic core 3 is formed in the annular shape by combining the two core parts 3A, the number of the core parts 3A is not limited, and the magnetic core 3 may be configured by combining three or more core parts.

While the aforementioned embodiments describe an example in which the locking part 27 is engaged with the through hole 95 that is arranged in the support 90, it may be configured such that the locking part 27 is engaged with a recess in a non-penetrating configuration.

While the aforementioned embodiments describe an example in which the claw receiver 23 comprises the movable portion 23A that can be displaced to the first position and the second position, the claw may comprise a movable portion that can be displaced to the first position and the second position. Alternatively, both the claw and the claw receiver may each comprise a movable portion that can be displaced to the first position and the second position.

While the aforementioned embodiments adopt the configuration in which the first housing 11 and the second housing 12 are fixed by the two locking mechanisms 13A and 13B, a hinge mechanism may be adopted as a substitute for the locking mechanism 13B located in the rear in the drawings. In this case also, release of the locking provided by the locking mechanism 13 is inhibited by inserting the support 90 into the support receivers 15 and 55, and thereby the magnetic core 3 can be firmly held. In the case of adopting the hinge mechanism, the first housing 11 and the second housing 12 may be configured as an integral mold.

While an example has been described in which the claw receiver 23 comprises the movable portion 23A that can be displaced to the first position and the second position, the claw may include a movable portion that can be displaced to the first position and the second position. Alternatively, both the claw and the claw receiver may each comprise a movable portion that can be displaced to the first position and the second position.

(4) Supplementary Descriptions

As is clear from the aforementioned descriptions of the example embodiments, the noise suppression member of the present disclosure may be further configured as follows.

In the noise suppression member of the present disclosure, a stopper may be provided in a position between the movable portion and the support with the support being inserted in the support receiver so as to inhibit displacement of the movable portion to the second position by the stopper being held between the movable portion and the support when the movable portion is displaced toward the second position. The stopper may be configured to be displaceable with the movable portion when the movable portion is displaced toward the second position with the support being not-inserted in the support receiver.

According to the noise suppression member configured as described above, the displacement of the movable portion to the second position is inhibited as a result of the aforementioned stopper being held between the movable portion and the support. Accordingly, even in a case where the support is arranged outside of a moving range of the movable portion, the claw can be maintained to be engaged with the claw receiver by a function of both the support and the stopper.

The noise suppression member of the present disclosure may be configured such that, when the movable portion is displaced toward the second position with the support being inserted in the support receiver, the support contacts the movable portion to thereby inhibit displacement of the movable portion to the second position.

According to the noise suppression member configured as above, the displacement of the movable portion to the second position is inhibited as a result of the support contacting the movable portion. Accordingly, in a case where the support is arranged within the moving range of the movable portion, the claw can be maintained to be engaged with the claw receiver by a function of the support alone.

The noise suppression member of the present disclosure may comprise a locking part to reduce a relative displacement between the support and the support receiver along a pull-out direction of the support from the support receiver by engagement of the locking part with an opening or a recess, which is provided in the support, when the support is inserted into the support receiver.

According to the noise suppression member configured as above, the locking part is engaged with the opening or the recess that is provided in the support, reducing the relative displacement between the support and the support receiver. Accordingly, the noise suppression member can be firmly fixed to the support in comparison with a case where the same locking part is not provided.

In a noise suppression member of the present disclosure, a support is configured to include, in a portion to be inserted into a support receiver, a plate-shaped base part and a bent part that is bent at ends of the base part and extends in a thickness direction of the base part. An insertion direction of the support into the support receiver is a direction that is perpendicular to both the thickness direction of the base part and the thickness direction the bent part. The support receiver includes a base part opening to allow insertion of the base part therein and a bent part opening to allow insertion of the bent part therein. The base part opening is configured so as to introduce the base part therein in a case where the support is oriented in any one of directions, a first direction and a second direction, which are a positional relationship where the thickness direction of the base part is reversed by 180 degrees. The bent part opening may be arranged both in a portion to introduce the bent part in a case where the support is oriented in the first direction and in a portion to introduce the bent part in a case where the support is oriented in the second direction.

The noise suppression member configured as above enables attachment to the support in two ways by reversing the noise suppression member by 180 degrees, in spite of the support being configured to include the base part and the bent part in the portion to be inserted into the support receiver. Thus, for the support, the configuration having the base part and the bent part, and high rigidity can be adopted, enabling enhancement of a degree of flexibility in directions in arranging the noise suppression member and the support.

EXPLANATION OF REFERENCE NUMERALS 1, 41 . . . noise suppression member, 2 . . . corrugated tube, 3 . . . magnetic core, 3A . . . core part, 5, 45 . . . case, 11 . . . first housing, 11A . . . recess, 12 . . . second housing, 13A . . . locking mechanism, 13A . . . one locking mechanism, 13B . . . the other locking mechanism, 15, 55 . . . support receiver, 17 . . . extending piece, 21 . . . claw, 23 . . . claw receiver, 23A . . . movable portion, 25 . . . opening, 25A . . . base part opening 25B . . . bent part opening, 27 . . . locking part, 29 . . . stopper, 90 . . . support, 91 . . . joint part, 93 . . . attachment part, 93A . . . base part, 93B . . . bent part, 95 . . . through hole.

The invention claimed is:

1. A noise suppression member comprising:
a magnetic core comprising core parts, each core part including a magnetic material, and formed in an annular shape by combining the core parts; and
a case configured to house the magnetic core, the case comprising:
   a first housing and a second housing that comprise respective recesses and form a housing space to house therein the magnetic core when the recesses are arranged opposite to each other;
   a locking mechanism that comprises a claw provided to at least one of the first housing or the second housing and a claw receiver provided to at least the other of the first housing or the second housing, and allows the first housing and the second housing to be fixed to each other through engagement of the claw with the claw receiver when the first housing and the second housing are arranged at a position where the housing space is formed; and
   a support receiver into which a support capable of supporting the case is inserted when the case is attached to the support,
at least one of the claw or the claw receiver comprising a movable portion displaceable to a first position and a second position, and being configured such that the claw is engaged with the claw receiver when the movable portion is displaced to the first position, whereas the claw is released from the claw receiver when the movable portion is displaced to the second position, and such that the movable portion is nondisplaceable to the second position when the support is inserted into the support receiver; and
a stopper provided in a position between the movable portion and the support with the support being inserted in the support receiver so as to inhibit displacement of the movable portion to the second position by the stopper being held between the movable portion and the support when the movable portion is displaced toward the second position,
wherein the stopper is configured to be displaceable with the movable portion when the movable portion is displaced toward the second position with the support being not-inserted in the support receiver.

2. A noise suppression member, comprising:
a magnetic core comprising core parts, each core part including a magnetic material, and formed in an annular shape by combining the core parts; and
a case configured to house the magnetic core, the case comprising:
   a first housing and a second housing that comprise respective recesses and form a housing space to house therein the magnetic core when the recesses are arranged opposite to each other;
   a locking mechanism that comprises a claw provided to at least one of the first housing or the second housing and a claw receiver provided to at least the other of the first housing or the second housing, and allows the first housing and the second housing to be fixed to each other through engagement of the claw with the claw receiver when the first housing and the second housing are arranged at a position where the housing space is formed;
   a support receiver into which a support capable of supporting the case is inserted when the case is attached to the support;
at least one of the claw or the claw receiver comprising a movable portion displaceable to a first position and a second position, and being configured such that the claw is engaged with the claw receiver when the movable portion is displaced to the first position, whereas the claw is released from the claw receiver when the movable portion is displaced to the second position, and such that the movable portion is nondisplaceable to the second position when the support is inserted into the support receiver; and
a locking part configured to reduce a relative displacement between the support and the support receiver along a pull-out direction of the support from the support receiver by engagement of the locking part with an opening or a recess that is provided in the support when the support is inserted into the support receiver.

3. A noise suppression member, comprising:
a magnetic core comprising core parts, each core part including a magnetic material, and formed in an annular shape by combining the core parts; and
a case configured to house the magnetic core, the case comprising:

a first housing and a second housing that comprise respective recesses and form a housing space to house therein the magnetic core when the recesses are arranged opposite to each other;

a locking mechanism that comprises a claw provided to at least one of the first housing or the second housing and a claw receiver provided to at least the other of the first housing or the second housing, and allows the first housing and the second housing to be fixed to each other through engagement of the claw with the claw receiver when the first housing and the second housing are arranged at a position where the housing space is formed; and a support receiver into which a support capable of supporting the case is inserted when the case is attached to the support, at least one of the claw or the claw receiver comprising a movable portion displaceable to a first position and a second position, and being configured such that the claw is engaged with the claw receiver when the movable portion is displaced to the first position, whereas the claw is released from the claw receiver when the movable portion is displaced to the second position, and such that the movable portion is nondisplaceable to the second position when the support is inserted into the support receiver, wherein the support comprises a portion to be inserted into the support receiver, the portion to be inserted comprising:

a plate-shaped base part, and a bent part bent at both ends of the base part and extending in a thickness direction of the base part, the support having an insertion direction into the support receiver, the insertion direction being perpendicular to both the thickness direction of the base part and a thickness direction of the bent part, wherein the support receiver comprises a base part opening that allows insertion therein of the base part and a bent part opening that allows insertion therein of the bent part, wherein the base part opening is configured so as to allow introduction of the base part when the support is oriented in any one of a first orientation and a second orientation, which have a positional relationship where the thickness direction of the base part is reversed by 180 degrees, and wherein the bent part opening is provided both in a portion to introduce the bent part in a case where the support is oriented in the first orientation and in a portion to introduce the bent part in a case where the support oriented is in the second orientation.

4. The noise suppression member according to claim 2, wherein, when the movable portion is displaced toward the second position with the support being inserted in the support receiver, the support contacts the movable portion to thereby inhibit displacement of the movable portion to the second position.

5. The noise suppression member according to claim 3, wherein, when the movable portion is displaced toward the second position with the support being inserted in the support receiver, the support contacts the movable portion to thereby inhibit displacement of the movable portion to the second position.

* * * * *